(12) United States Patent
Hansen

(10) Patent No.: US 10,870,767 B2
(45) Date of Patent: *Dec. 22, 2020

(54) MULTIFUNCTIONAL PAINTS AND CAULKS WITH CONTROLLABLE ELECTROMAGNETIC PROPERTIES

(71) Applicant: Conductive Composites Company IP, LLC, Heber City, UT (US)

(72) Inventor: George Clayton Hansen, Midway, UT (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/846,287

(22) Filed: Apr. 11, 2020

(65) Prior Publication Data

US 2020/0239711 A1    Jul. 30, 2020

Related U.S. Application Data

(63) Continuation of application No. 16/601,095, filed on Oct. 14, 2019, now Pat. No. 10,669,436.

(Continued)

(51) Int. Cl.
*C09D 5/24* (2006.01)
*H01B 1/22* (2006.01)
(Continued)

(52) U.S. Cl.
CPC .............. *C09D 5/32* (2013.01); *C09D 5/24* (2013.01); *C09D 7/61* (2018.01); *C09D 7/70* (2018.01);
(Continued)

(58) Field of Classification Search
CPC .... H01B 1/00; H01B 1/22; C09D 5/24; G21F 1/00; G21F 3/00
See application file for complete search history.

(56) References Cited

U.S. PATENT DOCUMENTS

| 4,408,255 A | 10/1983 | Adkins |
| 4,545,914 A | 10/1985 | Graiver et al. |

(Continued)

FOREIGN PATENT DOCUMENTS

| JP | 0907351 | 3/1997 |
| JP | 2000-208985 | 7/2000 |

(Continued)

OTHER PUBLICATIONS

Hansen, George; "Short Chopped Nickel Coated Fiber As a Conductive Additive to Displace Nickel Coated Graphite Powder"; Article and PowerPoint Presentation for Society for the Advancement of Material and Process Engineering; 2012.

*Primary Examiner* — Mark Kopec
(74) *Attorney, Agent, or Firm* — Madson IP, P.C.

(57) ABSTRACT

An electrically conductive paint/caulk is disclosed that may be applied by spraying, rolling, and/or brushing using conventional techniques/may be dispensed from a tube. The electrically conductive paint/caulk has a plurality of metal-coated fibers precision chopped to short lengths, optionally a plurality of conductive filament structures having a high-aspect ratio, and a polymer base. The metal-coated fibers and optional conductive filament structures are dispersed uniformly within the polymer base to create a complex electron transport system facilitating conductivity sufficient for a full range of electromagnetic properties including electrostatic dissipation, electrostatic discharge, and shielding. The complex electron transport system created facilitates the full range of electromagnetic properties with lower loadings of conductors, reduces viscosity, and the additional unloaded portion of paint/caulk receives other multifunctional additives.

20 Claims, 6 Drawing Sheets

Related U.S. Application Data

(60) Provisional application No. 62/768,740, filed on Nov. 16, 2018.

(51) Int. Cl.

| | | |
|---|---|---|
| *C09D 5/32* | (2006.01) | |
| *H05K 9/00* | (2006.01) | |
| *C09D 7/40* | (2018.01) | |
| *C09D 7/61* | (2018.01) | |
| C08K 3/08 | (2006.01) | |
| C08K 7/06 | (2006.01) | |
| C08K 9/10 | (2006.01) | |
| C08K 3/04 | (2006.01) | |

(52) U.S. Cl.
CPC ............... *H01B 1/22* (2013.01); *H05K 9/009* (2013.01); *H05K 9/0079* (2013.01); *C08K 3/04* (2013.01); *C08K 7/06* (2013.01); *C08K 9/10* (2013.01); *C08K 2003/0862* (2013.01); *C08K 2201/001* (2013.01); *C08K 2201/003* (2013.01)

(56) References Cited

U.S. PATENT DOCUMENTS

| | | | |
|---|---|---|---|
| 4,566,990 A | 1/1986 | Liu et al. | |
| 4,643,785 A | 2/1987 | Paynton | |
| 4,645,566 A | 2/1987 | Kato et al. | |
| 4,713,277 A | 12/1987 | Akiyama et al. | |
| 4,749,625 A | 6/1988 | Obayashi et al. | |
| 4,972,058 A | 11/1990 | Benson et al. | |
| 5,366,600 A | 11/1994 | Westhof et al. | |
| 5,366,664 A | 11/1994 | Vardan et al. | |
| 5,399,432 A | 3/1995 | Schleifstein et al. | |
| 5,601,945 A | 2/1997 | Clough | |
| 6,185,155 B1 | 2/2001 | Steinich | |
| 6,281,175 B1 * | 8/2001 | Lyons | A61P 23/00 508/491 |
| 6,303,180 B1 | 10/2001 | Bunyan et al. | |
| 6,344,978 B1 | 2/2002 | Komiya | |
| 6,533,963 B1 | 3/2003 | Schleifstein et al. | |
| 6,936,191 B2 | 8/2005 | Fox et al. | |
| 6,989,924 B1 | 1/2006 | Jorgensen et al. | |
| 7,129,422 B2 | 10/2006 | Arnold | |
| 7,183,484 B1 | 2/2007 | May | |
| 7,553,579 B2 | 6/2009 | Couse et al. | |
| 7,935,415 B1 | 5/2011 | Hansen et al. | |
| 7,947,773 B2 | 5/2011 | Hansen et al. | |
| 8,325,079 B2 | 12/2012 | Shah et al. | |
| 8,351,220 B2 | 1/2013 | Liang et al. | |
| 8,361,608 B1 | 1/2013 | Hansen et al. | |
| 8,415,568 B1 | 4/2013 | Hansen et al. | |
| 8,963,022 B2 | 2/2015 | Hansen et al. | |
| 9,144,185 B1 | 9/2015 | Hansen et al. | |
| 9,167,733 B2 | 10/2015 | Hansen et al. | |
| 9,287,023 B2 | 3/2016 | Hansen et al. | |
| 9,801,315 B2 | 10/2017 | Hansen et al. | |
| 10,039,216 B2 | 7/2018 | Hansen et al. | |
| 10,257,965 B1 | 4/2019 | Hansen et al. | |
| 2002/0039658 A1 | 4/2002 | Bunyan et al. | |
| 2003/0222249 A1 | 12/2003 | Bunyan et al. | |
| 2004/0001299 A1 | 1/2004 | van Haaster et al. | |
| 2004/0220327 A1 * | 11/2004 | Cosman | C08K 7/06 524/779 |
| 2008/0078576 A1 | 4/2008 | Blacker et al. | |
| 2008/0258119 A1 | 10/2008 | Kobayashi et al. | |
| 2009/0117268 A1 | 5/2009 | Lewis et al. | |
| 2011/0263924 A1 | 10/2011 | Yantasee et al. | |
| 2012/0319055 A1 | 12/2012 | Kim et al. | |
| 2013/0309396 A1 | 11/2013 | Legare | |
| 2014/0346409 A1 | 11/2014 | Witzel et al. | |
| 2016/0044834 A1 | 2/2016 | Hansen et al. | |
| 2018/0368294 A1 | 12/2018 | Hansen et al. | |

FOREIGN PATENT DOCUMENTS

| | | |
|---|---|---|
| KR | 2010036472 | 5/2001 |
| WO | WO1995022511 | 8/1995 |

* cited by examiner caulk

MULTIFUNCTIONAL PAINTS AND CAULKS WITH CONTROLLABLE ELECTROMAGNETIC PROPERTIES

RELATED APPLICATION

This application is a CON of Ser. No. 16/601,095 (filed Oct. 14, 2019, now U.S. Pat. No. 10,669,436), which application claims priority to Ser. No. 62/768,740 (filed Nov. 16, 2018).

BACKGROUND OF THE INVENTION

1. Field of the Invention

The present invention relates to paints and caulks having desired electromagnetic properties. More specifically, the present invention relates to new materials used for controlling the composition of paints and caulks to exhibit a range of electromagnetic capabilities, ranging from electrostatic dissipation, through electrostatic discharge, bleed, shielding, and lightning strike ($10^8$ to $10^{-3}$ ohm-cms), and the methodology for controlling what properties are manifested in the paints and/or caulks while permitting other functional additives to be inserted.

Various exemplary embodiments of the present invention are described below. Use of the term "exemplary" means illustrative or by way of example only, and any reference herein to "the invention" is not intended to restrict or limit the invention to exact features or steps of any one or more of the exemplary embodiments disclosed in the present specification. References to "exemplary embodiment," "one embodiment," "an embodiment," "some embodiments," "various embodiments," and the like, may indicate that the embodiment(s) of the invention so described may include a particular structure, feature, property, or characteristic, but not every embodiment necessarily includes the particular structure, feature, property, or characteristic. Further, repeated use of the phrase "in one embodiment," or "in an exemplary embodiment," does not necessarily refer to the same embodiment, although they may.

2. The Relevant Technology

Paint and caulking technology, particularly conductive paints and caulks have been used for many years. Usually, such paints and caulks are heavily loaded with silver or carbon to introduce conductivity. Because the known conductive paints and caulks are so heavily loaded to achieve conductivity, viscosity is high and loading other additives is precluded or severely limited. The cost-effective, efficient production of multifunctional paints and caulks, using a broad range of paint or caulk bases, and controlling the conductive additives composition to provide certain improved electromagnetic properties, such as electrostatic dissipation, electrostatic discharge, and shielding, would represent a significant advance beyond the conductive paints and caulks that have heretofore been developed.

Certain paints and caulks with historically sufficient levels of electromagnetic shielding capabilities have been developed; for example, U.S. Pat. No. 5,366,664 issued to Varadan et al. in 1994 is directed to such paints and caulks. Again, the known paints and caulks having electrostatic discharge or shielding capability that use the present state of the art, are expensive, complex to make, thick, and unable to receive other functional additive loading.

Although there have been some minor advances in paint and caulk conductivity in recent decades, the state of art remains inadequate to meet the current and future needs of a multifunctional marketplace.

Accordingly, a need exists for more efficient, cost-effective, efficacious paints and caulks with a full range of electromagnetic properties, flowable viscosity, and have multifunctional capabilities while providing desired electromagnetic properties. Achieving the desired electromagnetic properties, such as electrostatic dissipation, electrostatic discharge, and shielding with lower loadings of conductors reduces viscosity and the additional unloaded portion of paint or caulk may now receive other multifunctional materials. Such paints and caulks are disclosed herein.

SUMMARY OF THE INVENTION

The present disclosure describes developments responsive to the present state of the art and responsive to the problems and needs in the art that have not yet been fully solved by currently available paints and caulks. The multifunctional paints and caulks of the present disclosure are easily implemented and provide significant advances in efficiency, cost-effectiveness and efficacy. These multifunctional paints and caulks may be used in a broad range of situations requiring certain desired electromagnetic properties.

Exemplary embodiments of the paints and caulks of the present disclosure may comprise two or three basic components; namely, 1) Precision-chopped fiber (PCF); 2) optionally, a conductive filamentary structure having a high aspect ratio; 3) a paint or caulk base polymer; and 4) optionally having a viscosity adjusting solvent. By varying the amount and types of these three principal components, desired electromagnetic properties may be achieved in low cost, low loading, and low viscosity, efficacious paints and caulks produced efficiently.

For purposes of this disclosure, PCF is a metal-coated fiber (such as a nickel-coated fiber) chopped to a short, specific length requirement so that when added to a paint or caulk polymer, the paint may be applied by spraying, rolling, and/or brushing using conventional techniques and the caulk, being pliable, may be dispensed from a tube. The PCF may comprise any type of fibrous substrate, such as, for example, carbon fiber, cellulose fiber, cotton fiber, natural fibers, Kevlar, rayon, synthetic fibers, and nanofibers may be coated with a known conductive metal, including but not limited to nickel, aluminum, copper, silver, and gold. An example range of thickness for a nickel coating may be 5 to 500 nanometers. Exemplary PCF is precision chopped to lengths of 0.05 millimeters to 3 millimeters. For purposes of this disclosure, the term "precision chopped" means that the statistical distribution of length is within 50% of the mean; however, it may be preferred to use a statistical distribution of length within 10% of the mean for some embodiments. As one example, carbon fiber may be used. Because carbon has conductivity it offers some properties not available by using non-conductive fibers as the substrate. An exemplary nickel-coated carbon fiber PCF may have a carbon fiber having a diameter of 4 to 7 microns and a nickel coating of 50 to 500 nanometers, and precision chopped to a length from 0.1 millimeters to 1 millimeter.

The PCF of this disclosure is distinguishable from random-chopped fibers and milled fibers that are known and used in the art. By their very nature, random-chopped fibers and milled fibers have an excessively broad distribution of fiber lengths. The use of random-chopped fibers and milled fibers have significant drawbacks, including high loading to achieve desired conductivity, high viscosity, and constrained percolation. By using PCF, better percolation and conductivity, and lower and more controllable viscosity and loading is achieved across the full range of electromagnetic properties desired.

The PCF has been developed and produced by and is available from Conductive Composites Company of Heber City, Utah.

The conductive filamentary structure, such as a metal filamentary structure, having a high aspect ratio may be nickel nanostrands (see U.S. Pat. Nos. 7,935,415 and 7,947,773 incorporated herein by this reference as if fully disclosed herein) or a metal filamentary powder, such as but not limited to a nickel powder, provided each has an aspect ratio greater than one, and in some embodiments preferably having branching. Nickel nanostrands have been developed and produced by and are available from Conductive Composites Company of Heber City, Utah. Metal filamentary powders, such as nickel filamentary powder with a high aspect ratio, are known.

The paint or caulk base polymer may be water-borne or solvent-borne, one-part or two-part. The type of paint or caulk selected for a desired purpose will carry a load content of the PCF and optionally high-aspect ratio, conductive filamentary structure fine-tuned so that it achieves a desired electromagnetic property such as electrostatic dissipation, electrostatic discharge, or shielding. The PCF and high-aspect ratio, conductive filamentary structure work together to create a comprehensive network of electron transport pathways. The physical nature of PCF and the high-aspect ratio, conductive filamentary structure(s) facilitates the inter-fiber electron transport within the paint or caulk volume. The PCF act much like logs being elongated linear electron transport conduits and the conductive filamentary structures act much like tumble weeds that electrically interconnect the logs. For some exemplary embodiments, the use of PCF alone dispersed within a polymer base may achieve a desired electromagnetic property for a desired purpose or application. By adding conductive filamentary structures into the polymer base, the loading of PCF may be reduced commensurately, reducing cost, viscosity, and providing more space for multifunctional additives.

By using PCF and/or a nickel filamentary structure having a high aspect ratio dispersed uniformly within a paint or caulk base polymer, desired electromagnetic properties (for example, a range including electrostatic dissipation and electrostatic discharge with volume resistivity ranging from $10^8$ to $10^3$ ohm-cm) may be achieved while maintaining lower loads and therefore lower viscosity than known conductive paints and caulks.

Because the desired electromagnetic properties, such as electrostatic dissipation, electrostatic discharge, and shielding, can be achieved at lower loads and lower viscosity, the exemplary paints and caulks of the present disclosure may have robust functionality. Other particles may be loaded as functional additives giving the paints and caulk other functions. By way of example only, and not to be construed as limiting, functional additives such as coloring particles, hardening agents such as silicon carbide, lubricating agents, and magnetic particles have room in the matrix to be added to the extent that they do not functionally reduce the desired conductivity. Hence, colors of such paints and caulks now may be achieved across a broader spectrum of colors and may be more vibrant. The paints and caulks may harden faster and exhibit greater hardness. Further functionality may be exhibited by having different functions in different layers of the coating. Also, other desirable functions now may be exhibited in the paints and caulks without functionally sacrificing the needed conductivity. However, it should be understood that the list of functional additives recited above is not intended to be exhaustive. Rather, those skilled in the art are aware and may become aware of other functional additives that may be added to a paint or caulk to provide another function or characteristic. Such additional functional additives are contemplated to fall within the scope of this disclosure.

Interrelated methods are used to achieve a desired conductivity that will cause the paint or caulk to manifest the desired electromagnetic properties. Those skilled in the art of electron transport through materials, armed with this disclosure, intuitively and readily can determine and fine tune the interrelationships of the components to achieve the desired electromagnetic properties to be exhibited by the paint and caulk through known empirical means, and without undue experimentation.

The most basic parameters fall into the combination of two or three categories; 1) the fiber properties of the PCF; including length, diameter and coating thickness; 2) the properties of the conductive filamentary structure having a high aspect ratio, generally being approximately either sub-micron or larger than a micron in base diameter; and 3) the dielectric properties of the polymer.

By matching the interplay of the fiber properties of the PCF and the properties of the conductive filamentary structure (for example, a nickel filamentary structure) with dielectric properties of the polymer, the load ratio of PCF and nickel filamentary structure to polymer to achieve electrostatic discharge may be determined and fine-tuned for that polymer, whether it be a paint or a caulk. Generally, PCF and nickel filamentary structure may be added to increase conductivity to achieve a full range of desired electromagnetic properties ($10^8$ to $10^{-3}$ ohm-cms) and more robust functionality capabilities.

The interrelation of the PCF—metal (nickel) content, fiber diameter, and fiber length, when considered with the aspect ratio, base diameter, and the amount of branching exhibited by the conductive (nickel) filamentary structure, whether a filamentary powder or nanostrand, provides the desired conductivity. When additionally considered with the dielectric and polar properties of the polymer, the combination of PCF, conductive filamentary structure, and polymer creates a highly complex electron transport system which is difficult to model; however, the electron transport system may be standardly optimized by those skilled in the art, armed with this disclosure, through standard empirical derivation.

A known quantity of a certain PCF (fiber diameter, length, metal (nickel) content) may demonstrate more conductivity through increasing the addition of the conductive (nickel) filamentary structure component. Consequently, the loading percentage PCF may be reduced significantly because of the increased conductive (nickel) filamentary structure component. Therefore, the balance of the quantity and type of PCF against the quantity and type of conductive (nickel) filamentary structure may be used to engineer the desired viscosity, electrical conductivity, and functionality.

Furthermore, given a fixed exemplary mixture of PCF and nickel filamentary structure, the conductivity will also be determined as a function of the polymer type. For instance, a urethane base is more conductive than an acrylic base which, in turn, is more conductive than an epoxy base. The respective amounts of PCF and nickel filamentary structures may be adjusted based upon what type of polymer base is used.

These and other features of the exemplary embodiments of the present invention will become more fully apparent from the drawings and the following description, or may be learned by the practice of the invention as set forth hereinafter.

BRIEF DESCRIPTION OF THE DRAWINGS

The exemplary embodiments of the present invention is described more fully hereinafter with reference to the accompanying drawings, in which multiple exemplary embodiments of the invention are shown. Like numbers used herein refer to like elements throughout. This invention may, however, be embodied in many different forms and should not be construed as limited to the embodiments set forth herein; rather, these embodiments are provided so that this disclosure will be operative, enabling, and complete. Accordingly, the particular arrangements disclosed are meant to be illustrative only and not limiting the scope of the invention, which is to be given the full breadth of the appended claims and any and all equivalents thereof. Moreover, many embodiments, such as adaptations, variations, modifications, and equivalent arrangements, will be implicitly disclosed by the embodiments described herein and fall within the scope of the present invention.

Although specific terms are employed herein, they are used in a generic and descriptive sense only and not for purposes of limitation. Unless otherwise expressly defined herein, such terms are intended to be given their broad ordinary and customary meaning not inconsistent with that applicable in the relevant industry and without restriction to any specific embodiment hereinafter described. As used herein, the article "a" is intended to include one or more items. Where only one item is intended, the term "one", "single", or similar language is used. When used herein to join a list of items, the term "or" denotes at least one of the items, but does not exclude a plurality of items of the list. Additionally, the terms "operator", "user", and "individual" may be used interchangeably herein unless otherwise made clear from the context of the description.

Figure 1:
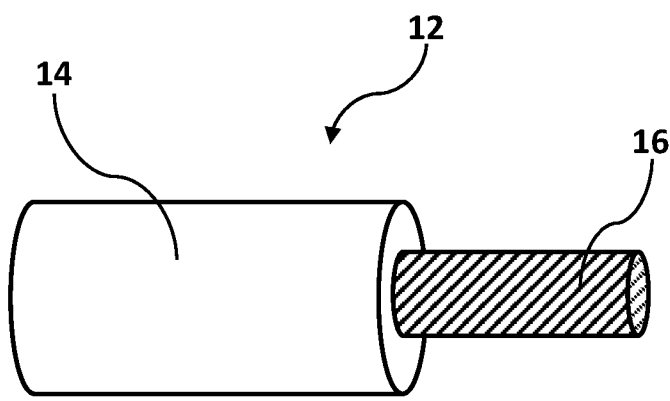
Figure 2:
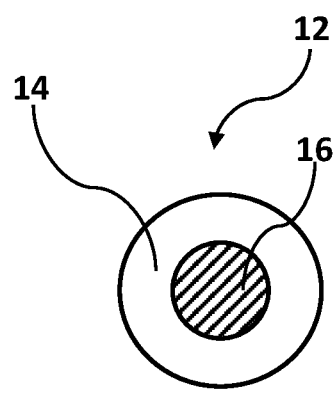
Figure 3:
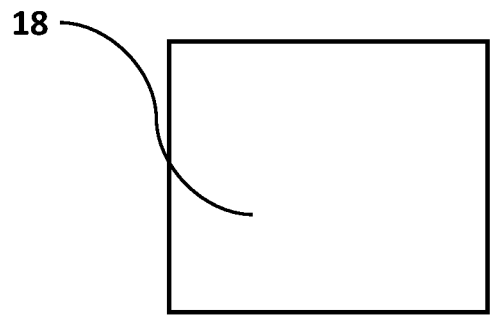
Figure 4:
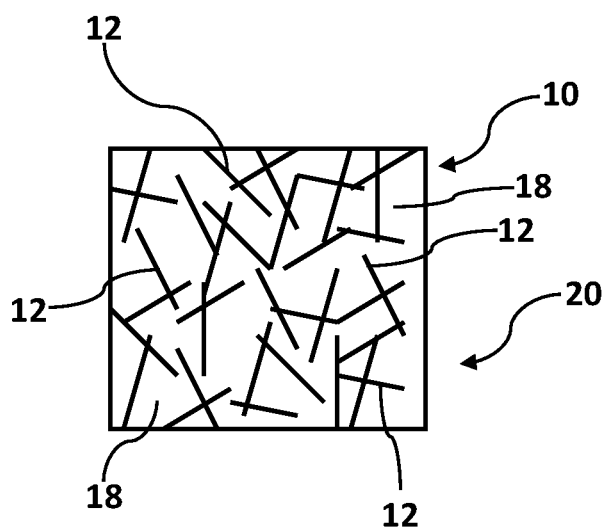
Figure 5:
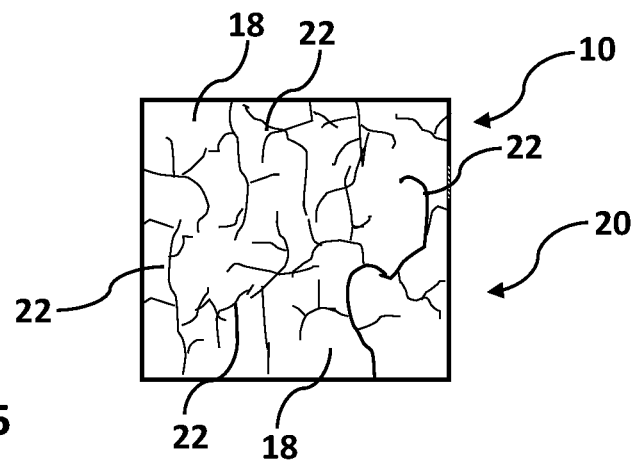
Figure 6:
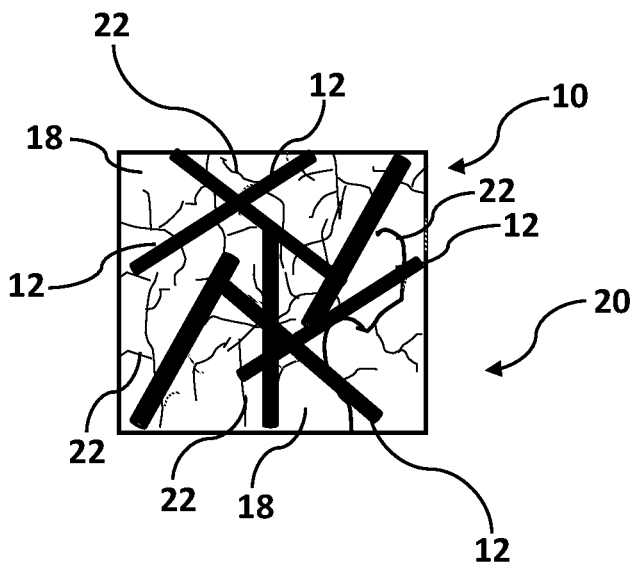
Figure 7:
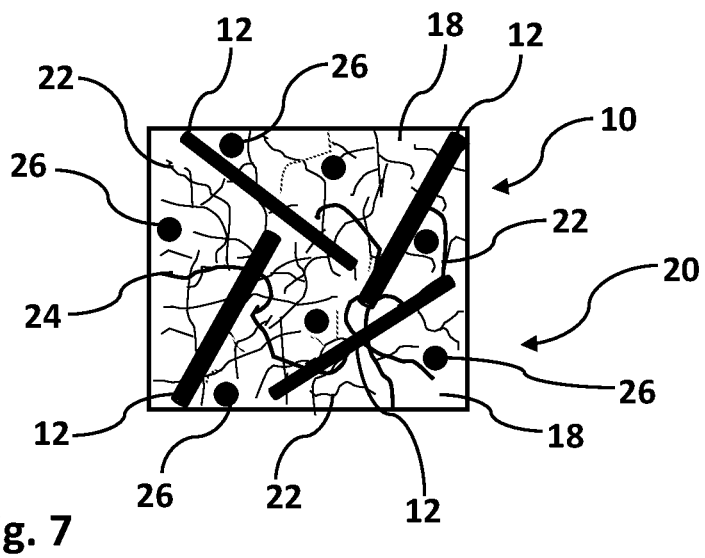
Figure 8:
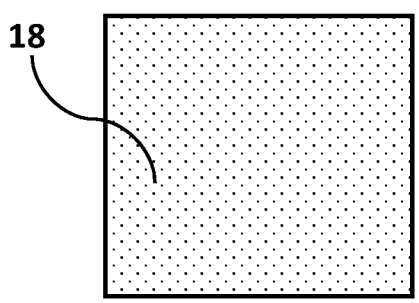
Figure 9:
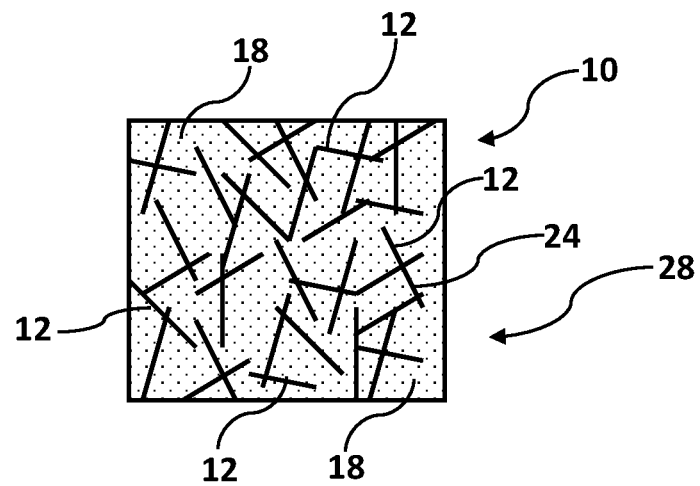
Figure 10:
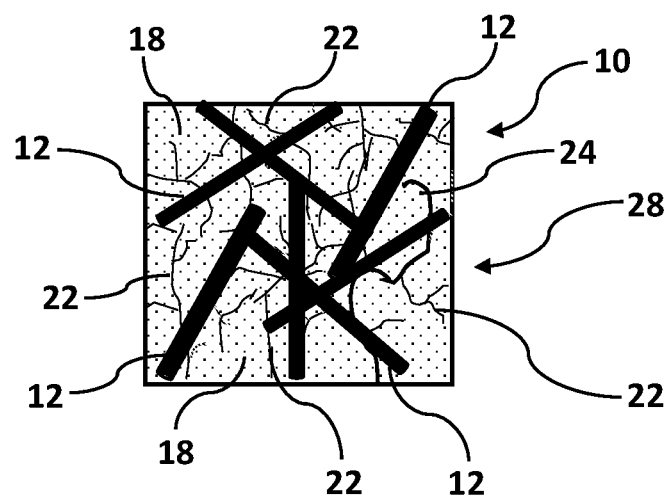
Figure 11:
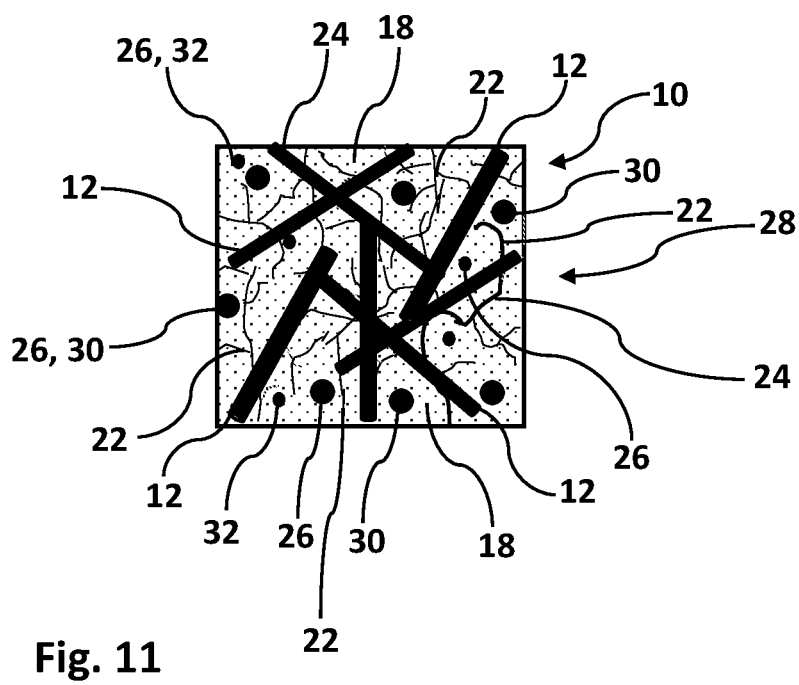

It should be understood that the drawings are schematic depictions of various components and embodiments and are not drawn to scale. Schematic depictions are being used in this application to assist in the understanding of relative relationships between the components. Understanding that these drawings depict only typical exemplary embodiments of the invention and are not therefore to be considered to be limiting of its scope, the invention will be described and explained with additional specificity and detail through the use of the accompanying drawings in which:

FIG. 1 is a perspective view of an exemplary embodiment of a precision-chopped fiber with a portion of the metal coating removed to reveal the fiber;

FIG. 2 is an end view of the exemplary precision-chopped fiber of FIG. 1 showing that the coating encircles the fiber;

FIG. 3 is a representative cross-sectional view of a portion of an exemplary embodiment of a polymer base for a paint;

FIG. 4 is a representative cross-sectional view of a portion of an exemplary embodiment showing PCF dispersed throughout the exemplary polymer base of FIG. 3;

FIG. 5 is a representative cross-sectional view of a portion of another exemplary embodiment showing conductive filamentary structures dispersed throughout the exemplary polymer base of FIG. 3;

FIG. 6 is a representative cross-sectional view of a portion of still another exemplary embodiment showing PCF and conductive filamentary structures dispersed throughout the exemplary polymer base of FIG. 3;

FIG. 7 is a representative cross-sectional view of a portion of yet another exemplary embodiment showing less PCF and more conductive filamentary structures than shown in FIG. 6 dispersed throughout the exemplary polymer base of FIG. 3 and with a multifunctional additive also dispersed therein;

FIG. 8 is a representative cross-sectional view of a portion of an exemplary embodiment of a polymer base for a caulk;

FIG. 9 is a representative cross-sectional view of a portion of another exemplary embodiment showing PCF dispersed throughout the exemplary polymer base of FIG. 8;

FIG. 10 is a representative cross-sectional view of a portion of still another exemplary embodiment showing PCF and conductive filamentary structures dispersed throughout the exemplary polymer base of FIG. 8; and FIG. 11 is a representative cross-sectional view of a portion of yet another exemplary embodiment showing PCF and conductive filamentary structures dispersed throughout the exemplary polymer base of FIG. 8 and with multifunctional additives also dispersed therein.

REFERENCE NUMERALS system 10
precision-chopped fiber(s) or PCF 12
metal coating or nickel coating 14
fiber(s) 16
polymer base 18
paint or electrically conductive paint 20
conductive filamentary structure(s) 22
electron transport pathway(s) 24
functional additive(s) 26
caulk 28
first additive 30
second additive 32

DETAILED DESCRIPTION OF THE INVENTION

The exemplary embodiments of the present disclosure will be best understood by reference to the drawings, wherein like parts are designated by like numerals throughout. It will be readily understood that the components of the exemplary embodiments of the present invention, as generally described and illustrated in the figures herein, could be arranged and designed in a wide variety of different configurations. Thus, the following more detailed description of the exemplary embodiments, as represented in the Figures, is not intended to limit the scope of the invention, as claimed, but is merely representative of exemplary embodiments of the disclosure.

Herein, the acronym "PCF" means precision-chopped fiber(s). Precision-chopped fiber includes fibers chopped to short, precise millimeter and sub-millimeter lengths, and may be coated or non-coated. Typically, PCF may act as a conductive additive to paints, gaskets, sealants, molding compounds, adhesives, mortar-based materials, and the like to enhance the conductivity of the product to which they are added. PCF is an off-the-shelf product available from Conductive Composites Company, but may also be obtained from any number of fiber converters such as Engineered Fiber Technology, LLC in Shelton, Conn.

The term "organic" refers to a class of chemical compounds that includes those existing in or derived from plants or animals and also includes compounds of carbon.

This detailed description, with reference to the drawings, describes a system 10 of components (FIGS. 4-7 and 9-11) used in exemplary embodiments and the methodology for controlling what properties are manifested in various paints and/or caulks so that other functional additives may be inserted.

Turning to FIG. 1, an exemplary embodiment of a single precision-chopped fiber 12 ("PCF") has a metal coating 14 enclosing a fiber 16 is shown. FIG. 1 is a schematic depiction (not drawn to scale, but exaggerating the dimensions so that the basic structure may be better understood) of a single PCF 12 with a portion of the metal coating 14 removed to reveal the fiber 16. Exemplary PCF 12 is precision chopped to lengths of 0.05 millimeters to 3 millimeters so that when added to a paint or caulk polymer, the paint may be applied by spraying, rolling, and/or brushing using conventional techniques and the caulk, being pliable, may be dispensed from a tube. The fiber 16 of the PCF 12 may comprise any type of fibrous substrate, such as, for example, carbon fiber, cellulose fiber, cotton fiber, natural fibers, Kevlar, rayon, synthetic fibers, and nanofibers. This list of fibrous substrates is not intended to be exhaustive. Those skilled in the art are aware and may become aware of other fibrous substrates that may be used. Such additional substrates are contemplated to fall within the scope of this disclosure.

As one example, carbon fiber 16 may be used, and because carbon has conductivity it offers some properties not available by using non-conductive fibers 16 as the substrate. Other types of fibers 16 have other characteristics that may bring other desired results to a paint or caulk. An exemplary fiber 16 may have a diameter of 3 to 7 microns.

FIG. 2 shows the metal coating 14 encircling the fiber 16. The fiber 16 may be coated with a known conductive metal, including but not limited to nickel, aluminum, copper, silver, and gold. This list of conductive metals is not intended to be exhaustive. Those skilled in the art are aware and may become aware of other conductive metals or alloys thereof that may be used. Such additional metals or alloys thereof are contemplated to fall within the scope of this disclosure.

An example thickness of a nickel coating may be 5 to 500 nanometers, and depending on the type, diameter, and length of the fiber 16 and the type of metal coating, this range of thickness correlates the metal coating 16 to about 15% to 78% of the PCF 12 by weight.

In one preferred embodiment, an exemplary nickel-coated carbon fiber PCF 12 may have a carbon fiber 16 having a diameter of 4 to 7 microns and a nickel coating of 50 to 500 nanometers, and preferably is precision chopped to a length from 0.1 millimeters to 1 millimeter. A nickel-coated carbon fiber PCF 12 with a carbon fiber 16 having a diameter of 7 microns and a nickel coating of 80 nanometers, and precision chopped to a length of 0.1 millimeters to 1 millimeter yields a PCF 12 that is 20% nickel by weight, and is particularly suitable for paints with electrostatic discharge capability. PCF 12 that are 40% nickel by weight has been demonstrated to be particularly suitable for shielding. An exemplary system 10 will become more conductive by using nickel-coated fibers 16 with higher coating thickness and/or higher PCF 12 loading into the system 10 and/or increasing PCF 12 length to provide a longer conductive path. However, fiber 16 length adversely affects dispersion requiring a balance to be struck between ease of dispersion and length of fiber. Thus, a 40% nickel coating is preferable for higher conductivity applications such as shielding. Conductivity evolves from the onset of establishing an electrical percolation network. Consequently, the onset of an electrical percolation is particularly important for low conductivity applications, such as electrostatic dissipation and electrostatic discharge. To that end, a unit weight of fiber with less nickel coating will yield more length of fiber per unit weight. Thus, for the same fiber loading into the system 10 matrix, a 20% nickel-coated fiber 16 will establish percolation at loadings lower than a 40% nickel-coated fiber 16, making 20% fiber particularly suitable for electrostatic dissipation and electrostatic discharge applications. It has been determined that electrostatic discharge is best established using 20% fiber at lengths precision chopped to 0.5 millimeters or greater.

FIG. 3 is a representative cross-sectional end view of a portion of an exemplary embodiment of a polymer base 18 for an electrically conductive paint 20. Paints are made with a wide range of viscosity, types of polymer bases, and other variables and characteristics. In each exemplary embodiment of the system 10, the conductivity is determined as a function of the polymer type. For instance, and by way of example only and not to limit the invention to any particular polymer base or group of polymer bases, a urethane base is more conductive than an acrylic base which, in turn, is more conductive than an epoxy base. Therefore, a different blend of components may be used to achieve desired properties in an electrically conductive paint 20 having a urethane base versus an acrylic base or an epoxy base.

FIG. 4 is a representative cross-sectional view of a portion of an exemplary embodiment showing PCF 12 dispersed throughout the exemplary polymer base 18 of FIG. 3. In the present state of the art, conductive paints are heavily loaded with silver or carbon to introduce conductivity. Because conductive paints are so heavily loaded to achieve conductivity, viscosity is high and loading other additives is precluded or severely limited. Also, paints having electrostatic discharge or shielding capability that use the present state of the art, are expensive, complex to make, thick, unable to receive other functional additive loading.

However, the system 10 of the present disclosure provides more efficient, cost-effective, efficacious electrically conductive paints 20 with a range of electromagnetic properties, flowable viscosity, and have multifunctional capabilities while providing desired electromagnetic properties. Introducing a dispersal of PCF 12 into the polymer base 18, as shown in FIG. 4, yields an electrically conductive paint 20 having desired electromagnetic properties over a full electromagnetic range ($10^8$ to $10^{-3}$ ohm-cms), including electrostatic dissipation, electrostatic discharge, and shielding with lower loadings of PCF 12 that reduces viscosity and the additional unloaded portion of the electrically conductive paint 20 may now receive other multifunctional materials.

The PCF 12 is distinguishable from random-chopped fibers and milled fibers that are known and used in the art. By their very nature, random-chopped fibers and milled fibers have an excessively broad distribution of fiber lengths. The use of random-chopped fibers and milled fibers have significant drawbacks including high loading to achieve desired conductivity, high viscosity, and constrained percolation. By using PCF 12, better percolation and conductivity, and lower and more controllable viscosity and loading is achieved across the desired range of electromagnetic properties ($10^8$ to $10^{-3}$ ohm-cms).

Exemplary embodiments of the electrically conductive paints 20 of the present disclosure may comprise two or three basic components; namely, 1) precision-chopped fiber (PCF) 12; 2) optionally, a conductive filamentary structure 22 having a high aspect ratio (See FIGS. 5-7); 3) a paint base polymer 18; and 4) optionally having a viscosity adjusting solvent. By varying the amount and types of these three principal components, desired electromagnetic properties may be achieved in low cost, low loading, and low viscosity, efficacious paints 20 produced efficiently. For some exemplary embodiments, the use of PCF 12 alone dispersed within the polymer base 18 may achieve a desired electromagnetic property for a desired purpose or application.

FIG. 5 is a representative cross-sectional view of a portion of another exemplary embodiment showing conductive filamentary structures 22 dispersed throughout the exemplary polymer base 18 of FIG. 3. The conductive filamentary structure 22, such as a metal filamentary structure 22, having a high aspect ratio, may be nickel nanostrands (see U.S. Pat. Nos. 7,935,415 and 7,947,773) or a metal filamentary powder, such as but not limited to a nickel powder, provided each has an aspect ratio greater than one, and in some embodiments the metal filamentary powder preferably having branching. Nanostrands have branching and may also provide additional mechanical strength to the composite.

FIG. 6 is a representative cross-sectional view of a portion of still another exemplary embodiment showing PCF 12 and conductive filamentary structures 22 dispersed throughout the exemplary polymer base 18 of FIG. 3. The most basic parameters fall into the combination of two or three categories; 1) the fiber properties of the PCF 12; including length, diameter and metal-coating 14 thickness; 2) the properties of the conductive filamentary structure 22 having a high aspect ratio, generally being approximately either sub-micron or larger than a micron in base diameter; and 3) the dielectric properties of the polymer base 18.

The paint polymer base 18 may be water-borne or solvent-borne, one-part or two-part. The type of polymer base 18 may be selected for a desired purpose and will carry a load content of the PCF 12 and optionally high-aspect ratio, conductive filamentary structure 22 fine-tuned so that it achieves a desired electromagnetic property such as electrostatic dissipation, electrostatic discharge, or shielding. The PCF 12 and high-aspect ratio, conductive filamentary structure 22 work together to create a comprehensive network of electron transport pathways 24. It should be understood that the electron transport pathways 24 that are created do not require the PCF 12 and/or conductive filamentary structures 22 to touch each other. They need only be sufficiently proximate to each other to transport electrons (acting much like an antennae).

The physical nature of PCF 12 and the high-aspect ratio, conductive filamentary structure(s) 22 facilitates the inter-fiber electron transport within the paint 20 volume. The PCF 12 act much like logs being elongated linear electron transport conduits and the conductive filamentary structures 22 act much like tumble weeds that electrically interconnect the logs. For some exemplary embodiments, the use of PCF 12 alone dispersed within a polymer base 18 may achieve a desired electromagnetic property for a desired purpose or application. By adding conductive filamentary structures 22 into the polymer base 18, the loading of PCF 12 may be reduced commensurately, reducing cost, viscosity, and providing more space for multifunctional additives.

By matching the interplay of the fiber properties of the PCF 12 and the properties of the conductive filamentary structure 22 (for example, a nickel filamentary structure) with dielectric properties of the polymer 18, the load ratio of PCF 12 and nickel filamentary structure 22 to polymer 18 to achieve electrostatic discharge may be determined and fine-tuned for that polymer 18. Generally, PCF 12 and nickel filamentary structure 22 may be added to increase conductivity to achieve a full range of desired electromagnetic properties ($10^8$ to $10^{-3}$ ohm-cms) and more robust functionality capabilities.

The interrelation of the PCF 12—metal (nickel) content, fiber 16 diameter, and fiber 16 length, when considered with the aspect ratio, base diameter, and the amount of branching exhibited by the conductive (nickel) filamentary structure 22, whether a filamentary powder or nanostrand, provides the desired conductivity. When additionally considered with the dielectric and polar properties of the polymer 18, the combination of PCF 12, conductive filamentary structure 22, and polymer 18 creates a highly complex electron transport system which is difficult to model; however, the electron transport system may be standardly optimized by those skilled in the art through empirical derivation.

A known quantity of a certain PCF 12 (fiber diameter, length, metal (nickel) content) may demonstrate more conductivity through increasing the addition of the conductive (nickel) filamentary structures 22. Consequently, the loading percentage of PCF 12 may be reduced significantly because of the increased conductive (nickel) filamentary structures 22. Therefore, the balance of the quantity and type of PCF 12 against the quantity and type of conductive (nickel) filamentary structures 22 may be used to engineer the desired viscosity, electrical conductivity, and functionality.

By using PCF 12 and/or a nickel filamentary structures 22 having a high aspect ratio dispersed uniformly within a paint polymer base 18, desired electromagnetic properties (for example, a range including electrostatic dissipation and electrostatic discharge with volume resistivity ranging from $10^8$ to $10^3$ ohm-cm) may be achieved while maintaining lower loads and therefore lower viscosity than known conductive paints.

FIG. 7 is a representative cross-sectional view of a portion of yet another exemplary embodiment showing less PCF 12 and more conductive filamentary structures 22 than shown in FIG. 6 dispersed throughout the exemplary polymer base 18 of FIG. 3. The exemplary embodiment shown in FIG. 7 depicts that by increasing conductive filamentary structures 22 less PCF 12 may be needed to achieve a particular electromagnetic property.

Also, because the desired electromagnetic properties, such as electrostatic dissipation, electrostatic discharge, and shielding, can be achieved at lower loads and lower viscosity, the exemplary paints 20 of the present disclosure may have robust functionality. Other particles may be loaded as functional additives 26 giving the paints 20 other functions. By way of example only, and not to be construed as limiting, functional additives 26 such as coloring particles, hardening agents such as silicon carbide, lubricating agents, and magnetic particles have room in the matrix to be added to the extent that they do not functionally reduce the desired conductivity. Hence, colors of such paints 20 now may be achieved across a broader spectrum of colors and may be more vibrant. The paints 20 may harden faster and exhibit greater hardness. Further functionality may be exhibited by having different functions in different layers (coats) of the paint 20. Also, other desirable functions now may be exhibited in the paints 20 without functionally sacrificing the needed conductivity.

FIG. 8 is a representative cross-sectional view of a portion of an exemplary embodiment of a polymer base 18 for an electrically conductive caulk 28. Similar to paints 20, caulks 28 also are made with a wide range of viscosity, types of polymer bases 18, and other variables and characteristics. In each exemplary embodiment of the system 10, the conductivity is determined as a function of the polymer type 18. For instance, and by way of example only and not to limit the invention to any particular polymer base 18 or group of polymer bases 18, a urethane base is more conductive than an acrylic base which, in turn, is more conductive than an epoxy base. Therefore, a different blend of components may be used to achieve desired properties in a caulk 28 having a urethane base versus an acrylic base or an epoxy base.

FIG. 9 is a representative cross-sectional view of a portion of another exemplary embodiment showing PCF 12 dispersed throughout the exemplary polymer base 18 of FIG. 8. In the present state of the art, conductive caulks 28, like conductive paints 20, are heavily loaded with silver or carbon to introduce conductivity. Because conductive caulks are so heavily loaded to achieve conductivity, viscosity is high and loading other additives 26 is precluded or severely limited. Also, caulks having electrostatic discharge or shielding capability that use the present state of the art, are expensive, complex to make, thick, unable to receive other functional additive 26 loading.

However, the system 10 of the present disclosure provides more efficient, cost-effective, efficacious electrically conductive caulk 28 with a range of electromagnetic properties, pliable viscosity, and have multifunctional capabilities while providing desired electromagnetic properties. Introducing a dispersal of PCF 12 into the polymer base 18 yields an electrically conductive caulk 28 having desired electromagnetic properties over a full electromagnetic range ($10^8$ to $10^{-3}$ ohm-cms), including electrostatic dissipation, electrostatic discharge, and shielding with lower loadings of PCF 12 that reduces viscosity and the additional unloaded portion of the electrically conductive caulk 28 may now receive other multifunctional materials (functional additives 26).

The PCF 12 is distinguishable from random-chopped fibers and milled fibers that are known and used in the art. By their very nature, random-chopped fibers and milled fibers have an excessively broad distribution of fiber lengths. The use of random-chopped fibers and milled fibers have significant drawbacks including high loading to achieve desired conductivity, high viscosity, and constrained percolation. By using PCF 12, better percolation and conductivity, and lower and more controllable viscosity and loading is achieved across the desired range of electromagnetic properties ($10^8$ to $10^{-3}$ ohm-cms).

Exemplary embodiments of the electrically conductive caulks 28 of the present disclosure may comprise two or three basic components; namely, 1) precision-chopped fiber (PCF) 12; 2) optionally, a conductive filamentary structure 22 having a high aspect ratio (See FIGS. 10-11); 3) a caulk polymer base 18; and 4) optionally having a viscosity adjusting solvent. By varying the amount and types of these three principal components, desired electromagnetic properties may be achieved in low cost, low loading, and low viscosity, efficacious caulks 28 produced efficiently. For some exemplary embodiments, the use of PCF 12 alone dispersed within the polymer base 18 of the caulk 28 may achieve a desired electromagnetic property for a desired purpose or application.

FIG. 10 is a representative cross-sectional view of a portion of still another exemplary embodiment showing PCF 12 and conductive filamentary structures 22 dispersed throughout the exemplary polymer base 18 of FIG. 8. The polymer base 18 for a caulk 28 may be water-borne or solvent-borne, one-part or two-part. The type of caulk 28 selected for a desired purpose will carry a load content of the PCF 12 and optionally high-aspect ratio, conductive filamentary structure 22 fine-tuned so that it achieves a desired electromagnetic property such as electrostatic dissipation, electrostatic discharge, or shielding. The PCF 12 and high-aspect ratio, conductive filamentary structures 22 work together to create a comprehensive network of electron transport pathways 24. The physical nature of PCF 12 and the high-aspect ratio, conductive filamentary structure(s) 22 facilitates the inter-fiber electron transport within the caulk 28 volume. The PCF 12 act much like logs being elongated linear electron transport conduits and the conductive filamentary structures 22 act much like tumble weeds that electrically interconnect the logs. For some exemplary embodiments, the use of PCF 12 alone dispersed within a polymer base 18 may achieve a desired electromagnetic property for caulk 28 having a desired purpose or application. By adding conductive filamentary structures 22 into the polymer base 18, the loading of PCF 12 may be reduced commensurately, reducing cost, viscosity, and providing more space for multifunctional additives 26.

By matching the interplay of the fiber properties of the PCF 12 and the properties of the conductive filamentary structure 22 (for example, a nickel filamentary structure 22) with dielectric properties of the polymer 18, the load ratio of PCF 12 and nickel filamentary structure 22 to polymer 18 to achieve electrostatic discharge may be determined and fine-tuned for that polymer 18, whether it be a paint 20 or a caulk 28. Generally, PCF 12 and nickel filamentary structures 22 may be added to increase conductivity to achieve a full range of desired electromagnetic properties ($10^8$ to $10^{-3}$ ohm-cms) and more robust functionality capabilities.

The interrelation of the PCF 12—metal (nickel) content, fiber 16 diameter, and fiber 16 length, when considered with the aspect ratio, base diameter, and the amount of branching exhibited by the conductive (nickel) filamentary structure 22, whether a filamentary powder or nanostrand, provides the desired conductivity. When additionally considered with the dielectric and polar properties of the polymer 18, the combination of PCF 12, conductive filamentary structure 22, and polymer 18 creates a highly complex electron transport system which is difficult to model; however, the electron transport system may be standardly optimized by those skilled in the art through empirical derivation.

A known quantity of a certain PCF 12 (fiber diameter, length, metal (nickel) content) may demonstrate more conductivity through increasing the addition of the conductive (nickel) filamentary structure 22 component. Consequently, the loading percentage PCF 12 may be reduced significantly because of the increased conductive (nickel) filamentary structure 22 component. Therefore, the balance of the quantity and type of PCF 12 against the quantity and type of conductive (nickel) filamentary structure 22 may be used to engineer the desired viscosity, electrical conductivity, and functionality.

By using PCF 12 and/or nickel filamentary structures 22 having a high aspect ratio dispersed uniformly within a polymer base 18 for a paint 20 or caulk 28, desired electromagnetic properties (for example, a range including electrostatic dissipation and electrostatic discharge with volume resistivity ranging from $10^8$ to $10^3$ ohm-cm) may be achieved while maintaining lower loads and therefore lower viscosity than known conductive paints and caulks.

FIG. 11 is a representative cross-sectional view of a portion of yet another exemplary embodiment showing PCF 12 and conductive filamentary structures 22 dispersed throughout the exemplary polymer base 18 of FIG. 8 with multiple functional additives 26 (for example, a first additive 30 and a second additive 32) also dispersed therein.

Also, because the desired electromagnetic properties, such as electrostatic dissipation, electrostatic discharge, and shielding, can be achieved at lower loads and lower viscosity, the exemplary caulks 28 of the present disclosure may have robust functionality. Other particles may be loaded as functional additives 26 giving the caulks 28 other functions. By way of example only, and not to be construed as limiting, functional additives 26 such as coloring particles, hardening agents such as silicon carbide, lubricating agents, and magnetic particles have room in the matrix to be added to the extent that they do not functionally reduce the desired conductivity. Hence, colors of such caulks 28 now may be achieved across a broader spectrum of colors and may be more vibrant. The caulks 28 may harden faster and exhibit greater hardness. Also, other desirable functions now may be exhibited in the caulks 28 without functionally sacrificing the needed conductivity.

As depicted in FIG. 11 as an example of a first additive 30 and a second additive 32, multiple functional additives 26 may be added to the polymer base 18 so long as there remains room within the polymer base 18 and the first additive or second additive or any other additional additive does not sacrifice the needed conductivity.

Interrelated methods are used to achieve a desired conductivity that will cause the paint 20 or caulk 28 to manifest the desired electromagnetic properties. Those skilled in the art of electron transport through materials, armed with this disclosure, intuitively and readily can determine and fine tune the interrelationships of the components to achieve the desired electromagnetic properties to be exhibited by the paint 20 and caulk 28 through known empirical means, and without undue experimentation.

For exemplary methods or processes of the invention, the sequence and/or arrangement of steps described herein are illustrative and not restrictive. Accordingly, although steps of various processes or methods may be shown and described as being in a sequence or temporal arrangement, the steps of any such processes or methods are not limited to being carried out in any specific sequence or arrangement, absent an indication otherwise. Indeed, the steps in such processes or methods generally may be carried out in different sequences and arrangements while still falling within the scope of the present invention.

Additionally, any references to advantages, benefits, unexpected results, preferred materials, or operability of the present invention are not intended as an affirmation that the invention has been previously reduced to practice or that any testing has been performed. Likewise, unless stated otherwise, use of verbs in the past tense (present perfect or preterit) is not intended to indicate or imply that the invention has been previously reduced to practice or that any testing has been performed.

Exemplary embodiments of the present invention are described above. No element, act, or instruction used in this description should be construed as important, necessary, critical, or essential to the invention unless explicitly described as such. Although only a few of the exemplary embodiments have been described in detail herein, those skilled in the art will readily appreciate that many modifications are possible in these exemplary embodiments without materially departing from the novel teachings and advantages of this invention. Accordingly, all such modifications are intended to be included within the scope of this invention as defined in the appended claims.

In the claims, any means-plus-function clauses are intended to cover the structures described herein as performing the recited function and not only structural equivalents, but also equivalent structures. Thus, although a nail and a screw may not be structural equivalents in that a nail employs a cylindrical surface to secure wooden parts together, whereas a screw employs a helical surface, in the environment of fastening wooden parts, a nail and a screw may be equivalent structures. Unless the exact language "means for" (performing a particular function or step) is recited in the claims, a construction under Section 112 is not intended. Additionally, it is not intended that the scope of patent protection afforded the present invention be defined by reading into any claim a limitation found herein that does not explicitly appear in the claim itself.

While specific embodiments and applications of the present invention have been described, it is to be understood that the invention is not limited to the precise configuration and components disclosed herein. Various modifications, changes, and variations which will be apparent to those skilled in the art may be made in the arrangement, operation, and details of the methods and systems of the present invention disclosed herein without departing from the spirit and scope of the invention.

Those skilled in the art will appreciate that the present embodiments may be embodied in other specific forms without departing from its structures, methods, or other essential characteristics as broadly described herein and claimed hereinafter. The described embodiments are to be considered in all respects only as illustrative, and not restrictive. The scope of the invention is, therefore, indicated by the appended claims, rather than by the foregoing description. All changes that come within the meaning and range of equivalency of the claims are to be embraced within their scope.

What is claimed is:

1. An electrically conductive paint that may be applied by spraying, rolling, and/or brushing using conventional techniques, the electrically conductive paint comprising:
    a plurality of nickel-coated carbon fibers comprising carbon fibers having diameters ranging from 3 microns up to 7 microns and a nickel coating, the nickel-coated carbon fibers being precision chopped to lengths of 0.05 millimeters to 1 millimeter;
    0% or more of a plurality of conductive filament structures having a branched structure and a high-aspect ratio; and
    a polymer base, the nickel-coated carbon fibers and the 0% or more of conductive filament structures being dispersed uniformly within the polymer base such that the volume resistivity of the electrically conductive paint ranges from $10^8$ to $10^3$ ohm-cm.

2. The electrically conductive paint of claim 1 wherein the nickel coating has a thickness such that the nickel ranges from 15% to 75% of the metal-coated fiber by weight.

3. The electrically conductive paint of claim 1 wherein the nickel coating has a thickness such that the nickel is about 20% of the metal-coated fiber by weight.

4. The electrically conductive paint of claim 1 wherein the nickel coating has a thickness such that the nickel is about 40% of the metal-coated fiber by weight.

5. The electrically conductive paint of claim 1 wherein the electrically conductive paint exhibits protection from at least one of electrostatic dissipation and electrostatic discharge.

6. The electrically conductive paint of claim 1 further comprising a functional additive.

7. The electrically conductive paint of claim 6 wherein the functional additive is selected from the group of functional additives consisting of coloring particles, hardening agents, lubricating agents, magnetic particles, and any combination of such additives.

8. A multifunctional, electrically conductive paint that may be applied by spraying, rolling, and/or brushing using conventional techniques, the electrically conductive paint comprising:
 a plurality of nickel-coated carbon fibers comprising carbon fibers and a nickel coating having a thickness such that the nickel ranges from 15% to 75% of the nickel-coated carbon fiber by weight, the nickel-coated carbon fibers being chopped to lengths of 0.05 millimeters to 1 millimeter;
 0% or more of a plurality of conductive filament structures having a branched structure and a high-aspect ratio;
 a functional additive, and
 a polymer base, the nickel-coated carbon fibers and the 0% or more of conductive filament structures being dispersed uniformly within the polymer base such that the volume resistivity of the electrically conductive paint ranges from $10^8$ to $10^3$ ohm-cm.

9. The multifunctional, electrically conductive paint of claim 8 wherein the functional additive is selected from the group of functional additives consisting of coloring particles, hardening agents, lubricating agents, magnetic particles, and any combination of such additives.

10. The multifunctional, electrically conductive paint of claim 8 wherein carbon fibers having diameters ranging from 3 microns up to 7 microns.

11. The multifunctional, electrically conductive paint of claim 8 wherein the nickel metal coating has a thickness such that the nickel is about 20% of the metal-coated fiber by weight.

12. The multifunctional, electrically conductive paint of claim 8 wherein the nickel metal coating has a thickness such that the nickel is about 40% of the metal-coated fiber by weight.

13. The multifunctional, electrically conductive paint of claim 8 wherein the electrically conductive paint exhibits protection from at least one of electrostatic dissipation and electrostatic discharge.

14. An electrically conductive caulk that is pliable and dispensable from a tube, the electrostatic discharge caulk comprising:
 a plurality of nickel-coated carbon fibers comprising carbon fibers having diameters ranging from 3 microns up to 7 microns and a nickel coating, the nickel-coated carbon fibers being chopped to lengths of 0.1 millimeters to 1 millimeter;
 0% or more of a plurality of conductive filament structures having a branching structure and a high-aspect ratio; and
 a polymer base, the nickel-coated carbon fibers and conductive structures being dispersed uniformly within the polymer base such that the volume resistivity of the electrically conductive caulk ranges from $10^8$ to $10^3$ ohm-cm.

15. The electrically conductive caulk of claim 14 further comprising a functional additive.

16. The electrically conductive caulk of claim 15 wherein the functional additive is selected from the group of functional additives consisting of coloring particles, hardening agents, lubricating agents, magnetic particles, and any combination of such additives.

17. The electrically conductive caulk of claim 14 wherein the nickel coating has a thickness such that the nickel ranges from 15% to 75% of the metal-coated fiber by weight.

18. The electrically conductive caulk of claim 14 wherein the nickel coating has a thickness such that the nickel is about 20% of the metal-coated fiber by weight.

19. The electrically conductive caulk of claim 14 wherein the nickel coating has a thickness such that the nickel is about 40% of the metal-coated fiber by weight.

20. The electrically conductive caulk of claim 14 wherein the electrically conductive paint exhibits protection from at least one of electrostatic dissipation and electrostatic discharge.

* * * * *